United States Patent [19]

Hardigg

[11] Patent Number: 4,998,636

[45] Date of Patent: Mar. 12, 1991

[54] ELECTRONIC RACK AND MOUNTING FRAME

[75] Inventor: James S. Hardigg, South Deerfield, Mass.

[73] Assignee: Hardigg Industries, Inc., South Deerfield, Mass.

[21] Appl. No.: 373,392

[22] Filed: Jun. 30, 1989

[51] Int. Cl.⁵ .............................................. F16B 7/00
[52] U.S. Cl. .................................. 220/4.34; 220/668
[58] Field of Search ............ 220/4 A, 4 R, 4 F, 4.33, 220/4.34, 668

[56] References Cited

U.S. PATENT DOCUMENTS

| | | | |
|---|---|---|---|
| 3,182,846 | 5/1965 | Kaff | 220/4 F |
| 3,955,702 | 5/1976 | Lundy | 220/4 F |
| 4,002,261 | 1/1977 | Litchfield | 220/4 F |
| 4,558,797 | 12/1985 | Mitchell | 220/4 F |

FOREIGN PATENT DOCUMENTS

1173744  5/1959  France ............................. 220/4 F

Primary Examiner—Joseph Man-Fu Moy
Attorney, Agent, or Firm—Fishman, Dionne & Cantor

[57] ABSTRACT

An electronic rack and mounting frame for protecting sensitive electronic equipment against damage caused by impacts and excessive vibration during shipping and handling. The frame has a plurality of vertical and horizontal frame members interconnected by internal splice members engaged within hollow interiors of the frame members at their distal ends to form front and rear frame panels. External splice members connect a plurality of side frame members between the front and rear frame panels to form a rectangular parallelpiped frame structure.

16 Claims, 5 Drawing Sheets

ELECTRONIC RACK AND MOUNTING FRAME

FIELD OF THE INVENTION

This invention relates to an electronic rack and mounting frame for protecting sensitive electronic equipment against damage caused by impacts and excessive vibration during shipping and handling.

BACKGROUND OF THE INVENTION

Loading and transporting sensitive electronic equipment has presented numerous problems. Typically, such equipment is packed in a suitable shipping container. Even slight impacts or vibrations to the container, however, produce shock forces that may damage precision instruments if they are not properly supported within the container.

To adequately protect electronic equipment, it is well known to use heavy-duty containers molded from polyethylene for high impact strength. An example of this type of shipping container is disclosed in U.S. Pat. No. 4,284,202, issued Aug. 8, 1981, to Barstow, Jr. It is also necessary to build into these rugged containers a shock-mitigation system that is capable of protecting the equipment from possible damage during shipping and other rough handling. One known system employs a mounting rack constructed from a plurality of welded vertical and horizontal frame members and shock mounts designed to hold the electronic equipment stationary and to absorb shocks.

The problem with that prior art electronic rack mounting frames is that the vertical and horizontal members are Gas Shielded Tungsten Arc (TIG) welded together to form an integral frame structure. Although the welded rack frame is sufficiently strong to withstand most impacts and transmit the shock forces produced thereby from the shock mounts to the electronic equipment without damage, there are difficulties associated with its construction.

First and foremost is the time required to weld the various frame members together and to correct any distortions caused during the welding process, which adds considerably to the cost of manufacturing the mounting rack. Because of imprecisions in the welding process, it is difficult to maintain alignment of the mounting holes which are used to secure the electronic equipment modules to the rack. A further disadvantage of a welded rack system is the storage space required to keep finished racks in stock in order to fill orders promptly.

SUMMARY OF THE INVENTION

An object of the present invention is to provide a low cost rack and mounting frame that is capable of supporting electronic equipment modules inside a container and preventing damage thereto caused by impacts and vibration during shipping and handling of the container. A further object of the present invention is to provide a rack and mounting frame having frame members that can be assembled quickly and easily in accordance with precise dimensional tolerances, and that can be disassembled if desired.

To accomplish those and other objects, the electronic rack and mounting frame according to the present invention comprises a plurality of vertical and horizontal frame members formed with a hollow interior and a plurality of side frame members. A first connecting means is provided within the hollow interiors of the vertical and horizontal frame members for detachably securing the distal ends of the vertical frame members to the distal ends of the horizontal frame members to form a front frame panel and a rear frame panel. A second connecting means detachably secures the distal ends of the side frame members to the front and rear frame panels.

The vertical and horizontal frame members can be made hollow throughout their entire lengths from an extrudable, high tensile strength aluminum material. The vertical frame members of the front frame panel have a plurality of threaded mounting holes spaced a distance corresponding to the spacing of a plurality of mounting holes in the electronic equipment module that is to be mounted to the frame. In addition, the hollow vertical and horizontal frame members have a substantially rectangular cross-section such that the frame members are defined by a front and rear wall and a pair of side walls.

The first connecting means comprises an L-shaped, internal splice member having a vertical leg portion and a horizontal leg portion which are joined at right angles at a central portion. The vertical and horizontal leg portions of the internal splice member have a cross-sectional shape corresponding approximately to the cross-sectional shape of the hollow interiors of the vertical and horizontal frame members so that the vertical leg portion fits within the hollow interior of one of the vertical frame members and the horizontal leg portion fits within the hollow interior of one of the horizontal frame members. The distal ends of the vertical frame members have a cut-out portion in one of the side walls such that the vertical leg portion and the central portion of the internal splice member is received inside the hollow interior of the vertical frame member. The distal ends of the vertical frame members are also formed with an angular surface corresponding to an angular surface of the central portion of the internal splice members. The cut-out portions are dimensioned such that each vertical leg portion and central portion of the internal splice member is received within the hollow interior of the vertical frame member to a point where the angular surface of the central portion is substantially aligned with the angular surface of the vertical frame member and an outer surface of the horizontal leg portion of the internal splice member is substantially aligned with an outer end surface of the vertical frame member.

The vertical leg portion of each internal splice member has at least one hole formed therein such that when the vertical leg member is received within the hollow interior of the vertical frame member, the hole aligns with at least one corresponding hole in the front and rear walls of the vertical frame member. In this way, the vertical leg of the internal splice member can be secured to the vertical frame members by pin means, such as a headless roll spring pin, fitted within the aligned holes.

The second connecting means includes an L-shaped, external splice member having a vertical leg portion and a horizontal leg portion which are joined at right angles at a central portion. Each vertical leg portion of the external splice members is detachably secured to one of the distal ends of the vertical frame members and each horizontal leg portion of the external splice members is detachably secured to one of the distal ends of the horizontal frame members. At least one hole is formed in the vertical and horizontal leg portions of each external splice member and at least one corresponding hole is formed in the front and rear walls of the vertical and horizontal frame members. Corresponding holes are provided in the vertical and horizontal leg portions of the internal splice members. In that way, a plurality of screws can engage the holes to detachably secure the external splice members to the front and rear frame panels.

The side frame members are secured at their distal ends to the external splice members. The central portion of each external splice member is provided with an angled outer surface with respect to the outer surfaces of the vertical and horizontal leg portions of the external splice member. The side frame members have a central portion and outer portions angled with respect to the central portion such that an inner surface of each side member has a contour corresponding to that of the outer surface of a corresponding external splice member. The distal ends of each side frame member is provided with at least one hole which is aligned with at least one threaded hole in the outer surfaces of the external splice members so that the side frame members can be detachably secured to the external splice members by way of screws.

The rack and mounting frame according to the present invention can comprise additional features including a horizontally-extending ledge portion provided on the horizontal frame members of the front frame panel for preventing foreign materials from contaminating the internal components of the electronic equipment modules. Furthermore, the frame can be reinforced by diagonally-extending brace members detachably secured to the side frame members. Also, the side frame members are provided with a plurality of shock mounts for supporting the frame within a hollow interior of a transport container.

Other objects, features, and characteristics of the present invention, as well as the methods, operation, and functions of the related elements of the structure, and the combination of parts and economies of manufacture, will become more apparent upon consideration of the following description and the appended claims with reference to the accompanying drawings, all of which form a part of this specification, wherein like reference numerals designate corresponding parts in the various figures.

BRIEF DESCRIPTION OF THE DRAWINGS

The instant invention may best be understood with reference to the accompanying drawings wherein.

DETAILED DESCRIPTION OF THE INVENTION

Figure 1:
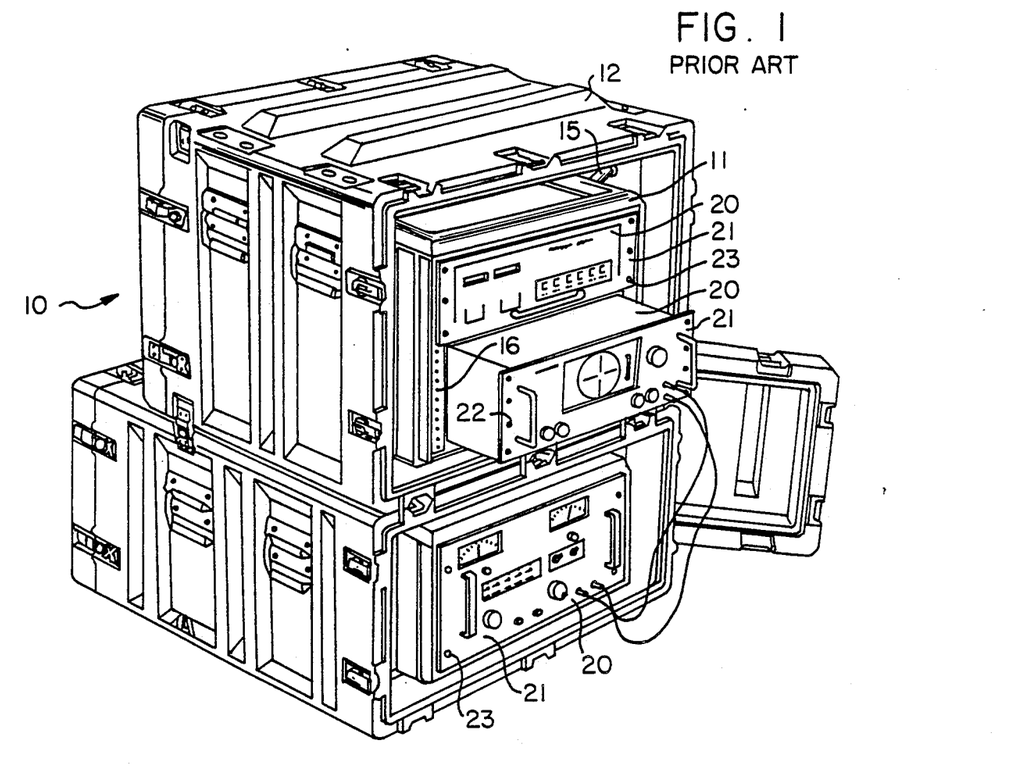
FIG. 1 is a perspective view of a prior art rack and mounting frame installed within a shipping container.

FIG. represents a prior art rack and mounting system 10 for shipping and handling sensitive electronic equipment 20. The rack and mounting system 10 employs a rack frame 11 that fits within a heavy-duty, molded container 12. The electronic equipment 20 is provided with a bezeled front panel 21 in which holes 22 are formed for securing the equipment to the rack frame 11.

Figure 2:
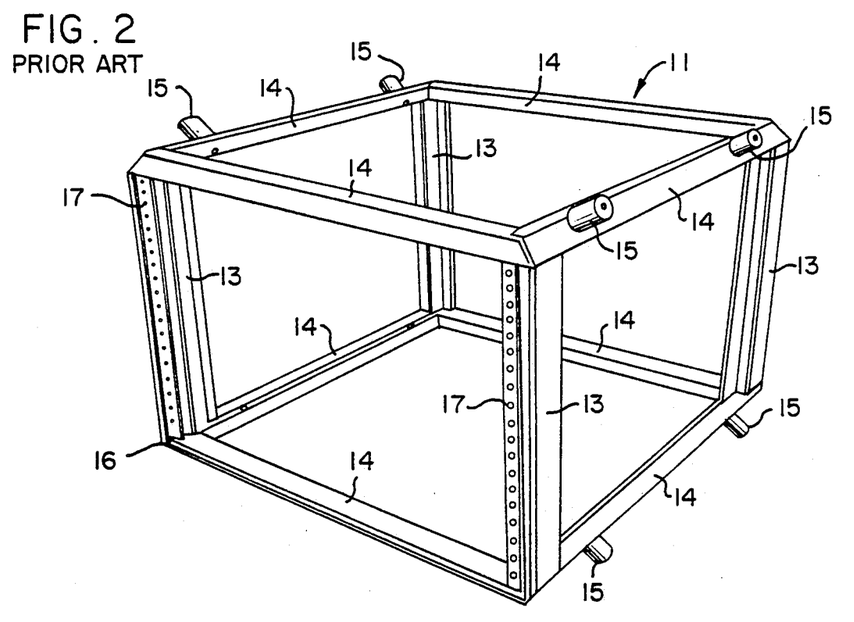
FIG. 2 is a perspective view of the prior-art rack and mounting frame shown in FIG. 1.

Referring to FIG. 2, the rack system 10 is constructed from a plurality of vertical and horizontal members 13, 14 extruded from aluminum which are TIG-welded at their distal ends to form a rectangular parallelpiped frame structure. A pair of rubber shock mounts 15 are mounted at a 45 degree angle, in spaced relation, on each horizontal member 14 running in the fore-to-aft direction. The shock mounts 15 are dimensioned so that they engage corner brackets (not shown) mounted inside the molded container 12, thereby suspending the rack frame 11 within the hollow interior thereof.

The vertical extrusion members 13 forming the front panel 16 of the rack frame 11 are provided with an Electronic Industries Association (EIA) standard hole pattern 17, the spacing of which corresponds to that of holes 22 provided in the front 15 panel 21 of electronic equipment module 20. The electronic equipment modules 20 are secured to the rack frame 11 by bolts 23 that extend through holes 22 in front panels 21 and into holes 17 in vertical frame members 13. A nut held by a spring clip (not shown) allows the bolt to be securely tightened against the frame.

If the container 12 should suffer an impact during shipping or handling, the vertical extrusion members 13 will be subjected to considerable bending forces in the fore-to-aft and lateral directions. Although the rack and mounting system of FIG. 2 is considered strong enough to adequately protect the sensitive electronic equipment modules supported therein from high impact forces, the TIG welding of the extruded frame members 13, 14 is time-consuming which, consequently, increases the cost of manufacturing the rack frame 11. The TIG welding further distorts the frame members which must be laboriously corrected. In addition, the accuracy of the distance between the two rows of mounting holes is difficult to control in the rack system of FIG. 2 due to variations in the shrinkage of the welds. Also, because the welds permanently secure the frame members of rack frame 11 together, it is impossible to disassemble frame 11 if desired.

Figure 3:
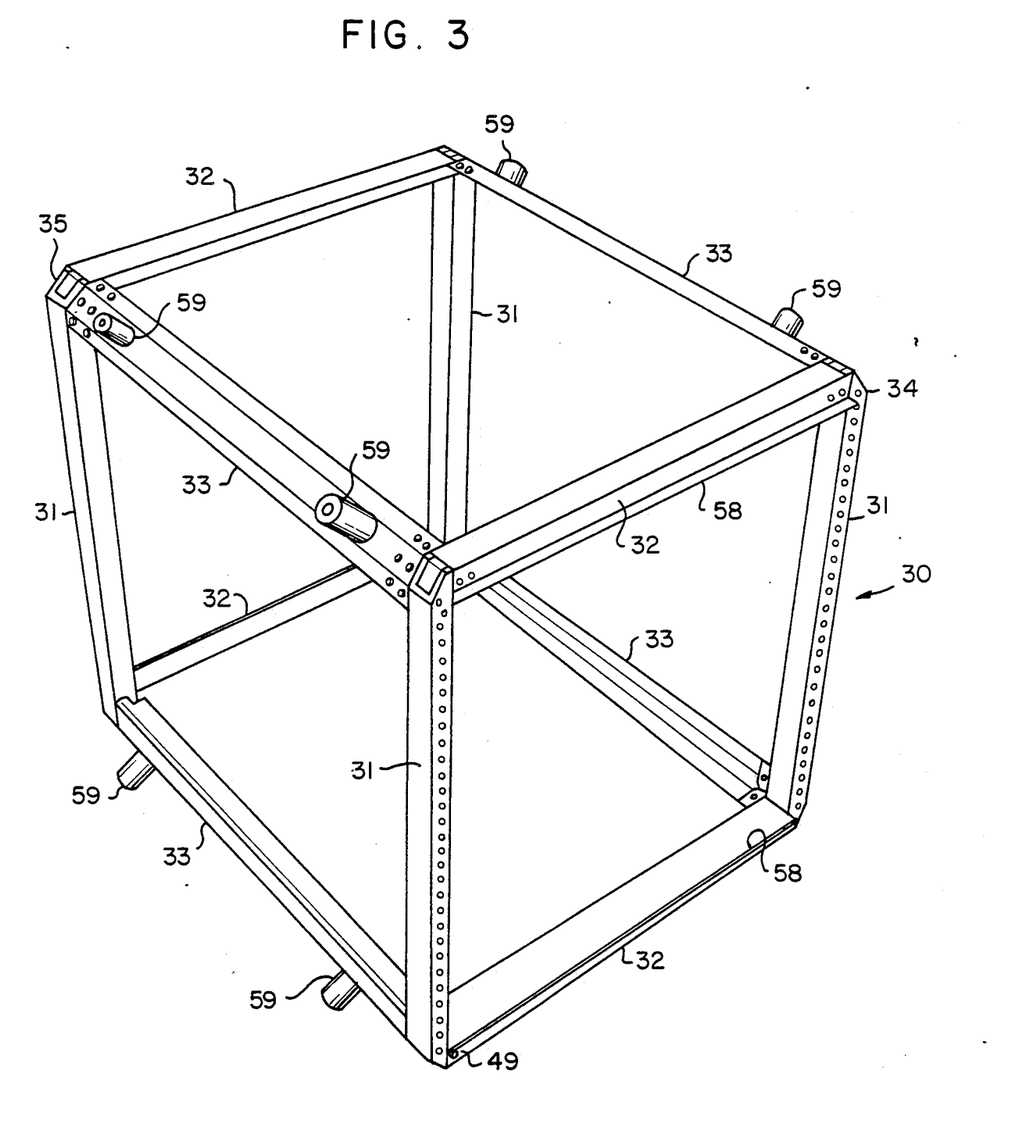
FIG. 3 is a perspective view of an assembled rack and mounting frame according to the present invention.

The rack system 30 according to the present invention is shown in FIG. 3 and is designed to overcome the deficiencies in the prior art rack system described above. Rack system 30, like the prior art device of FIG. 2, uses a rectangular parallelpiped frame structure comprising vertical and horizontal frame members 31, 32 and side frame members 33, all of which are preferably made from extruded, high tensile strength aluminum 6061-T6 or 6005-T5. Alternatively, frame members 31-33 could be made out of magnesium or any other extrudable material. The side frame members 33 are provided with a pair of rubber shock mounts 59, similar to those disclosed in connection with the prior art device shown in FIG. 2, for mounting the rack frame 30 within the hollow interior of a transport container.

Figures 4, 5:
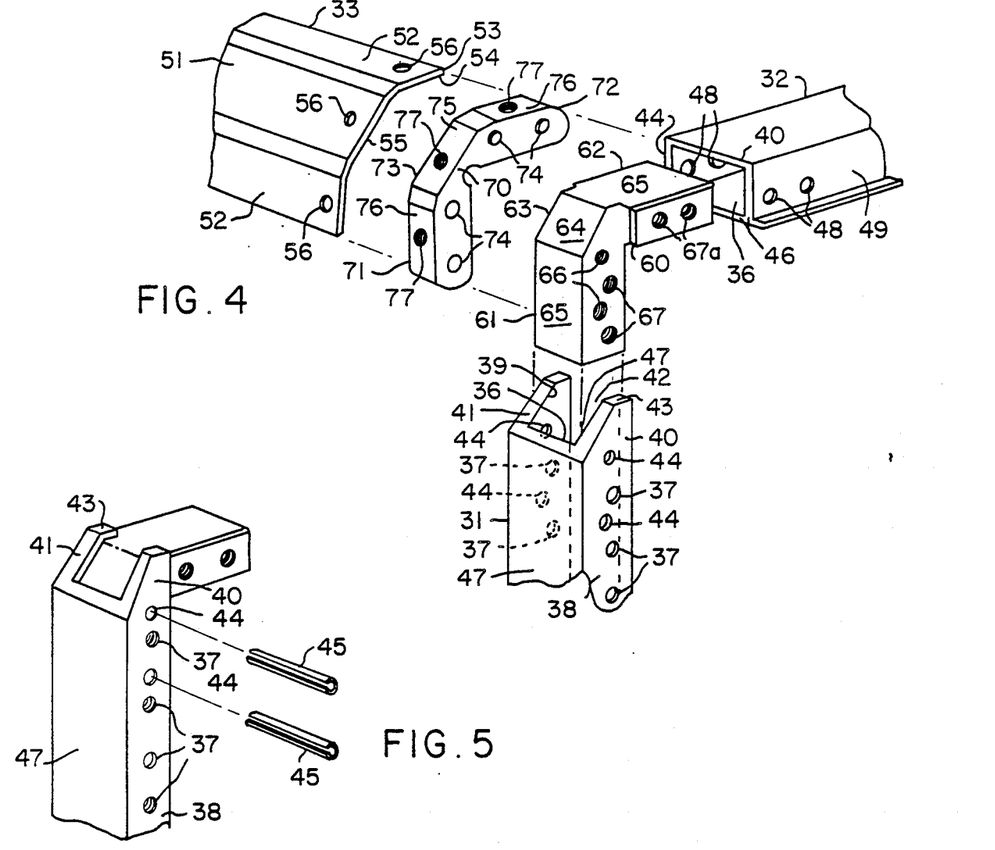
FIG. 4 is an exploded perspective view of the connections between the various frame members of the rack and mounting frame according to the present invention.
FIG. 5 is a perspective view of the connection between an internal splice member and a vertical frame member according to the present invention.

The vertical and horizontal frame members 31, 32 that make up the front and back frame panels 34, 35 of the rack frame 30 are extruded tubes having a rectangular cross-section with hollow interiors 36, as illustrated in FIG. 4. The vertical frame members 31 differ slightly in their construction from the horizontal frame members 32. The vertical frame members 31 that constitute front frame panel 34 are provided with a standard pattern of threaded mounting holes 37 for No. 10-32 screws. The holes 37 extend the length of the front and rear walls 38, 39 of frame member 31 for securing the front bezel panel of an electronic equipment module to the frame. In addition, the distal end 40 of each vertical member 31 is machined to form a U-shaped angular surface 41.

The front and rear walls 49 of the horizontal frame members 32 are preferably constructed with a thickness of 0.1 inches to provide sufficient strength to resist bending moments. The height of each horizontal frame member 32 is preferably 0.62 inches to provide sufficient bending stiffness to maintain the squareness of the front and rear rack faces when the rack is in an unloaded condition. The height of the horizontal frame members 32 does not significantly add to the height of the rack when the space required for the shock mounts 59 is taken into account. The width of the vertical frame members is preferably 0.625 inches with a total rack width of 19 inches—the same width as that of standard bezel plates of most electronic equipment modules. The thickness of the front and rear walls 38, 39 of the vertical frame members 31 is 0.25 inches so that the screws that fasten the bezel plates and other members to the members 31 are threadably engaged sufficiently to utilize their tensile strength.

The vertical frame members 31 and the horizontal frame members 32 are joined together at their distal ends 40 using L-shaped internal splice members 60 cut from extruded aluminum. Each internal splice member 60 is made up of a vertical leg portion 61 and a horizontal leg portion 62 which are joined at right angles by a central portion 63 such that the outer face surfaces 65 of leg portions 61, 62 form a 45 degree angle with the outer face surface 64 of central portion 63. The leg portions 61, 62 have a rectangular cross-section corresponding approximately to the cross-section of the hollow interiors 36 of the vertical and horizontal frame members 31, 32.

To assemble the vertical and horizontal frame members 31, 32 of the front and back frame panels 34, 35, the vertical leg portion 61 of an internal splice member 60 is inserted into the hollow interior 36 of a vertical member 31. Each distal end 40 of the vertical member 31 has a rectangular cut-out portion 42 along its inner side wall 47. The cut-out 42 is dimensioned to allow vertical leg portion 61 and central portion 63 of internal splice member 60 to be received inside the hollow interior 36 of the vertical frame member 31 up to the point where the angular surface 64 of central portion 63 of the internal splice member 60 is substantially aligned with the angular surface 41 of the vertical frame member 31. In turn, the upper horizontal surface 65 of the horizontal leg portion 62 is substantially aligned with the outermost end surface 43 of the vertical frame member 31.

A pair of pin holes 66 are drilled through the vertical leg portion 61 of each internal splice member 60. Pin holes 66 are arranged such that when the vertical leg portion 61 is positioned within the hollow interior 36 of a vertical frame member 31, the pin holes 66 align with corresponding pin holes 44 formed in the front and rear walls 38, 39 near the distal end 40 of vertical frame member 31.

Figure 9:
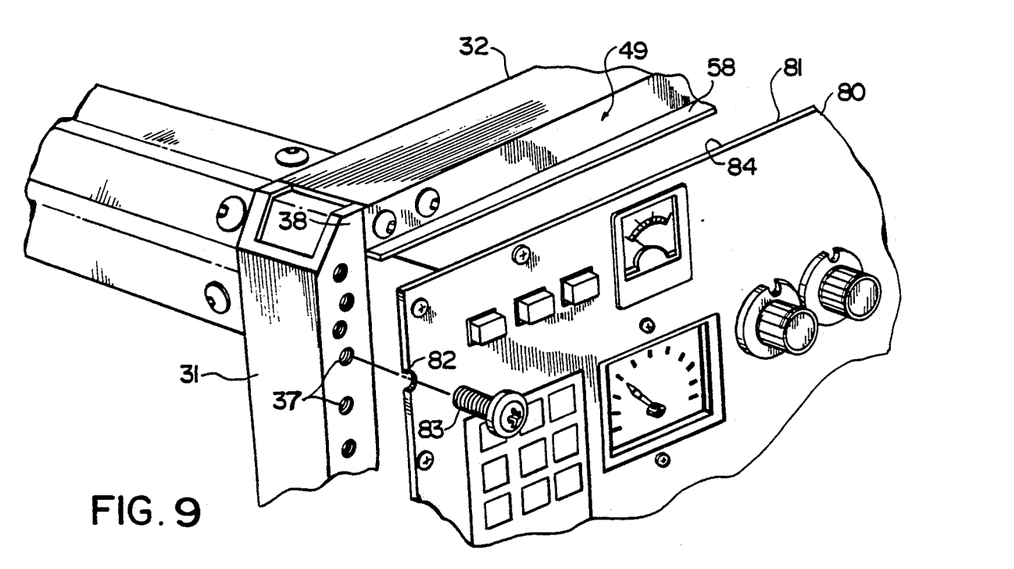
FIG. 9 is a perspective view showing the connection of an electronic equipment module to the front panel of an assembled rack and mounting frame according to the present invention.

As illustrated in FIG. 5, the vertical leg 61 of each internal splice member 60 is fastened to its corresponding vertical frame member 31 by way of roll spring pins 45 which fit through the aligned pin holes 44, 66 in the vertical frame member 31 and vertical leg portion 61 of internal splice member 60. Roll spring pins are preferred for their high shear strength, although other pins, such as spiral or solid pins, could also be used. The spring pins 45 are headless having a length less than the width of side walls 47 and, consequently, pins 45 fit between the upper two EIA standard holes 37 of the vertical frame members 31 without interfering with the holes 37 or the bezel plate 81 of an electronic equipment module 80 mounted to vertical frame members 31 (FIG. 9).

The horizontal leg portion 62 of the internal splice member 60 is inserted into the hollow interior 36 of the corresponding horizontal frame member 32 up to the point where the outermost end surface 46 of the horizontal frame member 32 abuts the inner side wall 47 of the vertical frame member The internal splice members 60 are machined to fit closely in the vertical frame members 31 in the fore-to-aft direction, but need not fit closely in the lateral direction. The internal splice members 60 are also machined to provide a close fit inside the horizontal frame members 32 in the lateral direction, but not in the vertical direction.

After all of the vertical and horizontal frame members 31, 32 have been assembled to make up the front and rear frame portions 34, 35 of the rack frame 30, the side members 33 are ready to be assembled. As shown in FIG. 4, the side members 33 are made from metal strips having a flat central portion 51 and outer portions 52 that are bent at 45 degree angles with respect to the central portion 51. The distal ends 53 of the side members 33 are attached at each corner of the front and rear frame portions 34, 35 by means of an L-shaped, external splice member 70 made preferably from extruded aluminum.

The external splice member 70 is made up of a vertical leg portion 71 and a horizontal leg portion 72 connected at right angles by a central portion 73 such that the outer face surfaces 76 of leg portions 71, 72 form a 45 degree angle with the outer face surface 75 of central portion 73. A pair of unthreaded holes 74 are formed through each of the vertical and horizontal leg portions 71, 72 of the external splice member 70. Holes 74 in the vertical leg portion 71 align with two threaded holes 37 in the upper portion of the front and rear walls 38, 39 of vertical frame member 31, and align with unthreaded holes 67 in the vertical leg portion of the internal splice member 60. Holes 74 in the horizontal leg portion 72 are aligned with unthreaded holes 48 in the front and rear walls 49 of horizontal frame member 32 and with threaded holes 67a in the horizontal leg portion of the internal splice member 60.

Figure 6:
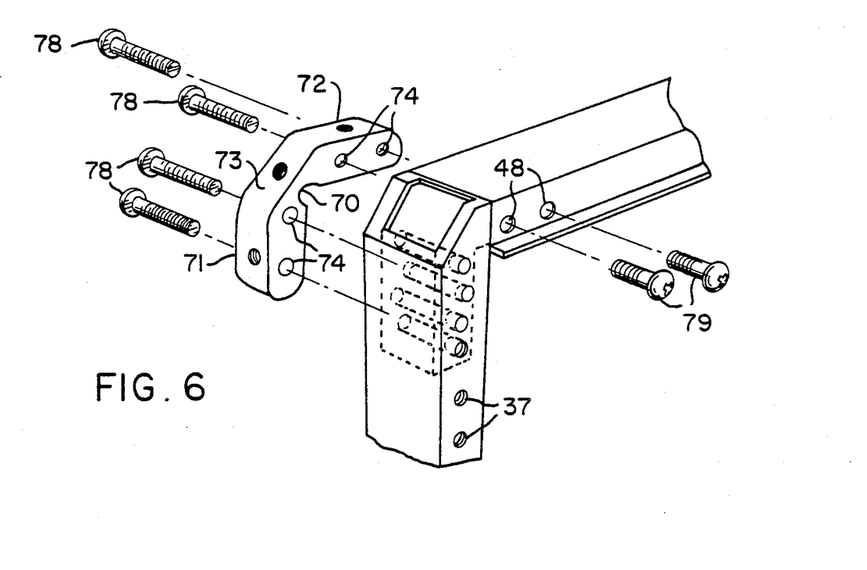
FIG. 6 is a perspective view of the connection of an external splice member to the vertical and horizontal frame members according to the present invention.

As shown in FIG. 6, two screws 78 pass through the unthreaded holes 74 in the vertical leg portion 71 of each external splice member 70 and screw into the threaded holes 37 in the rear wall 39 of vertical frame member 31. Holes 67 in the vertical leg portion 61 of internal splice member 60 are slightly larger in diameter than the screws 78 that fasten the vertical leg portion 71 of the external splice member 70. That allows the screws 78 to protrude through the rear wall 39 with full thread engagement and, thus, maximize the strength of the attachment. Holes 67 also provide clearance for the screws that are used to attach a bezel plate to the frame and are threaded into the holes 37 on the front wall 38 of vertical frame members 31.

Two screws 78 also pass through the unthreaded holes 74 in the horizontal leg portion 72 of the external splice member 70 and through the unthreaded holes 48 in the rear wall 49 of the horizontal frame member 32. Screws 78 are threaded into holes 67a in the horizontal leg portion 62 of internal splice member 60. Two additional screws 79 pass through unthreaded holes 48 in the front wall 49 of horizontal frame member 32 and screw into the threaded holes 67a in the horizontal leg portion 62 of internal splice member 60.

Figures 7, 8:
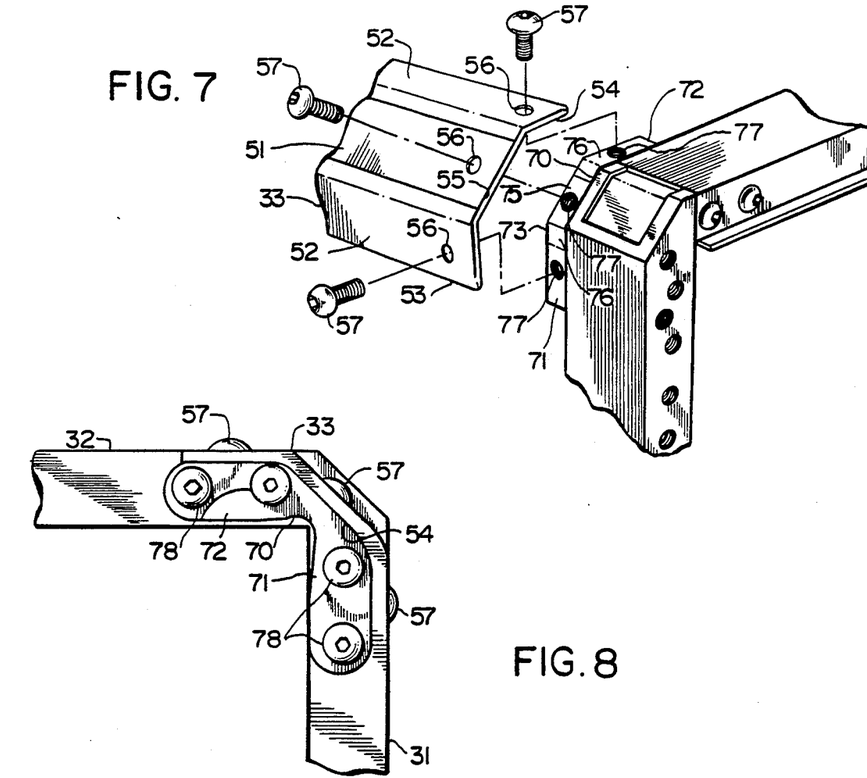
FIG. 7 is a perspective view of the connection of a side frame member to an external splice member according to the present invention.
FIG. 8 is a rear view of the completed assembly shown in FIG. 7.

Referring now to FIGS. 7 and 8, the side frame members 33 are secured at each distal end 53 to the external splice member 70 secured in each corner of the front and rear frame panels 34, 35. The inner surface width of central portion 51 of the side frame members 33 corresponds approximately to the outer surface length of angular portion 73 of the external splice member 70. The width of the outer portions 52 of the side frame members 33 corresponds approximately to the lengths of the vertical and horizontal leg portions 71, 72 of the external splice member 70. In this arrangement, the lower surfaces 54 of the side frame members 33 at their distal ends 53 lie in flat engagement with the outer surfaces 75, 76 of the external splice member 70. The side frame member 33 is laid over the external splice member 70 up to the point that the outer end surface 55 abuts the side walls 39, 49 of vertical and horizontal frame members 31, 32. In that position, holes 56 in the distal end 53 of each side frame member 33 align with corresponding holes 77 threaded in the central portion 73 and the vertical and horizontal leg portions 71, 72 of the external splice member 70. Screws 57 can then be passed through the aligned holes 56, 77 to firmly secure each side frame member 33 to its respective external splice members 70.

After all the side frame members 33 have been secured, electronic equipment modules 80 can be mounted to the rack 30, as shown in FIG. 9. Each electronic equipment module is provided with a front bezel panel 81 which is an integral part of the electronic equipment module 80 to be mounted. Holes 82, which follow EIA standards, are provided in bezel panel 81 so that holes 82 align with the threaded holes 37 provided along the front side wall 38 of the vertical frame members 31 comprising front frame panel 34. Screws 83 passing through holes 82 and threaded into holes 37 secure the electronic equipment module 80 to the rack 30.

An additional feature of the present invention, shown in FIG. 9, includes an outward projecting, horizontally-extending ledge 58 incorporated on the bottom edge of front side wall 49 of the top horizontal frame member 32 forming the front frame panel 34. The ledge 58 is dimensioned to extend over the top surface 84 of the bezel plate 81 of the uppermost electronic equipment module 80. This arrangement reduces the amount of dirt, moisture, and other foreign materials that deposit along the top surface 84 of bezel plate 81 and contaminate the internal components of the electronic equipment module 80. As shown in FIG. 3, a ledge 58 is also provided along the top edge of the front side wall 49 of bottom horizontal frame member 32 for the same purpose.

Figure 10:
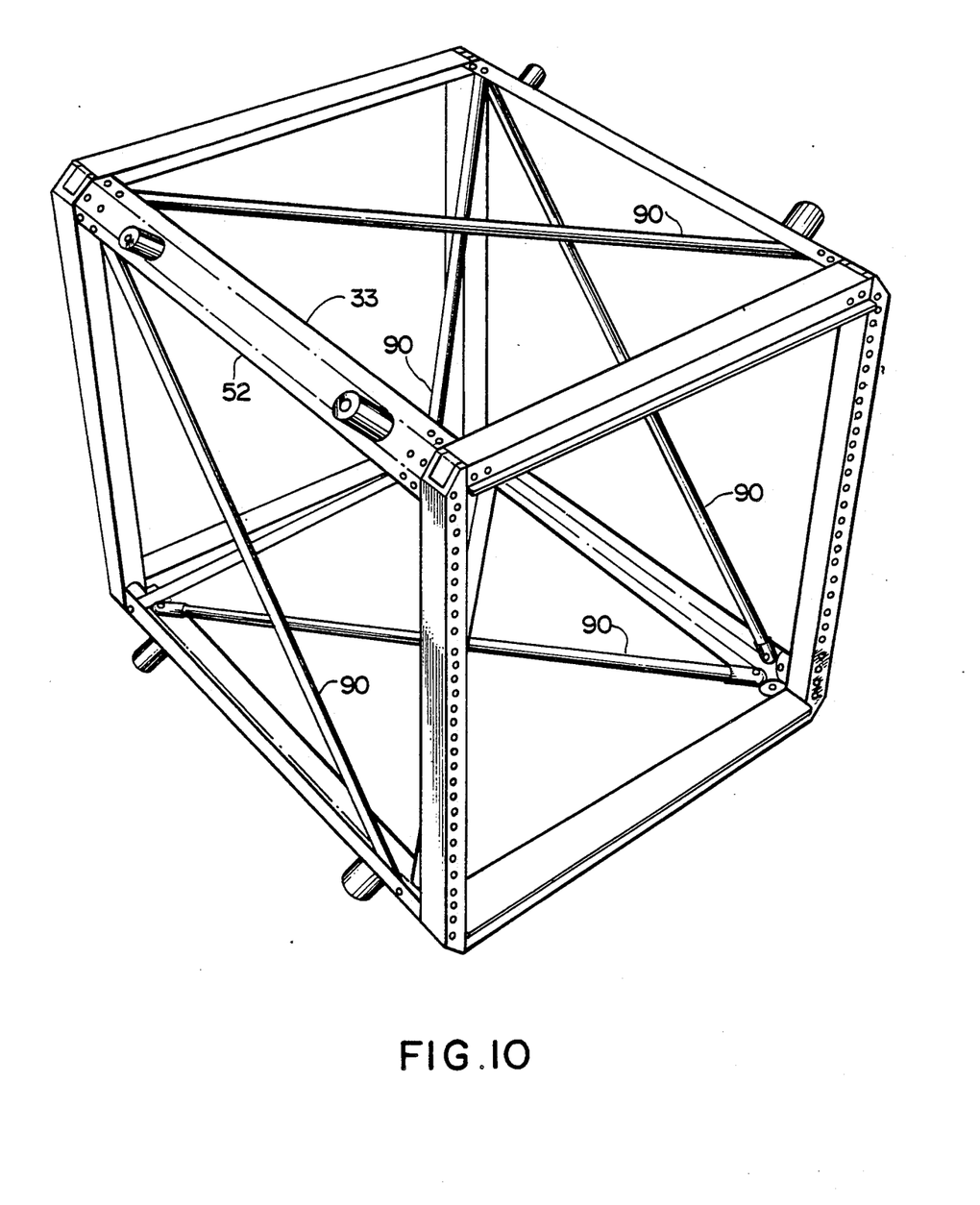
FIG. 10 is a perspective view of the rack and mounting frame according to the present invention that has been further strengthened with brace members.

The construction of the rigid rack frame 30 is sufficient to withstand most impacts and vibrations and, thus, prevent damage to sensitive electronic equipment secured thereto. However, should it be desirable to further strengthen the frame 30, rigid, diagonally-extending brace members 90 can be screwed to the outer portions 52 of side frame members 33 in the pattern illustrated in FIG. 10.

Although the invention has been described in connection with what is presently considered to be the most practical and preferred embodiment, it is to be understood that the invention is not to be limited to the disclosed embodiment, but, on the contrary, is intended to cover various modifications and equivalent arrangements included within the spirit and scope of the appended claims, which scope is to be accorded the broadest interpretation to encompass all such modifications and equivalent structures.

What is claimed is:

1. An electronic rack and mounting frame for shipping and handling sensitive electronic equipment modules, comprising:
    a plurality of hollow, substantially rectangular shaped vertical frame members having front, rear and a pair of sidewalls and distal ends, said distal ends of said vertical frame members having a cutout portion in one of said sidewalls;
    a plurality of hollow, substantially rectangular shaped horizontal frame members having front, rear and a pair of sidewalls and distal ends;
    a plurality of side frame members having distal ends;
    first connecting means disposed within the hollow interior of said vertical and horizontal frame members for detachably securing said distal ends of said vertical frame members to said distal ends of said horizontal frame members to form a front frame panel and a rear frame panel, said first connecting means comprising an L-shaped, internal splice member having a vertical leg portion and a horizontal leg portion joined together at right angles at a central portion, said vertical leg portion and said central portion being disposed in the hollow interior of said vertical frame member; and
    second connecting means for detachably securing said distal ends of said side frame members to said front and rear frame panels said second connecting means comprising an L-shaped external splice member having a vertical leg portion and a horizontal leg portion joined at right angles at a central portion.

2. The electronic rack and mounting frame as set forth in claim 1, wherein said vertical and horizontal leg portions of said internal splice member have a cross-sectional shape corresponding approximately to the cross-sectional shape of said hollow interiors of said vertical and horizontal frame members so that said vertical leg portion fits within said hollow interior of one of said vertical frame members and said horizontal leg portion fits within said hollow interior of one of said horizontal frame members.

3. The electronic rack and mounting frame as set forth in claim 2, wherein said distal ends of said vertical frame members are formed with an angular surface and said central portions of said internal splice members have corresponding angular surfaces, said cut-out portions dimensioned such that each vertical leg portion and central portion of said internal splice member is received within said hollow interior of said vertical frame member to a point where said angular surface of said central portion is substantially aligned with said angular surface of said vertical frame member and an outer surface of said horizontal leg portion of said internal splice member is substantially aligned with an outer end surface of said distal end of said vertical frame member.

4. The electronic rack and mounting frame as set forth in claim 1, wherein said vertical frame members comprising said front frame panel are provided with a plurality of threaded mounting holes, said mounting holes spaced a distance corresponding to the spacing of a plurality of mounting holes in said electronic equipment module for mounting an electronic equipment module to said frame.

5. The electronic rack and mounting frame as set forth in claim 2, wherein said vertical leg portion of each internal splice member has at least one hole formed therein such that when said vertical leg member is received within said hollow interior of said vertical frame member, said at least one hole aligns with at least one corresponding hole in said front and rear walls of said vertical frame member, said vertical leg of said internal splice member secured to said vertical frame members by pin means fitted within said aligned holes.

6. The electronic rack and mounting frame as set forth in claim 5, wherein said pin means comprise headless roll spring pins having a length less than the width of said side walls of said vertical frame member.

7. The electronic rack and mounting frame as set forth in claim 1, wherein each vertical leg portion of said external splice members is detachably secured to one of said distal ends of said vertical frame members and each horizontal leg portion of said external splice members is detachably secured to one of said distal ends of said horizontal frame members.

8. The electronic rack and mounting frame as set forth in claim 7, wherein at least one hole is formed in said vertical and horizontal leg portions of each external splice member and at least one corresponding hole is formed in said front and rear walls of said vertical and horizontal frame members and said vertical and horizontal leg portions of said internal splice members, said external splice members detachably secured to said front and rear frame panels by way of screws passing through said corresponding holes.

9. The electronic rack and mounting frame as set forth in claim 7, wherein said side frame members are secured at their distal ends to said external splice members.

10. The electronic rack and mounting frame as set forth in claim 9, wherein said central portion of each external splice member is provided with an angled outer surface with respect to outer surfaces of said vertical and horizontal leg portions of said external splice member, said side frame members having a central portion and outer portions angled with respect to said central portion such that an inner surface of said side members has a contour corresponding to that of said outer surfaces of said external splice member.

11. The electronic rack and mounting frame as set forth in claim 10, wherein said distal ends of each side frame member is provided with at least one hole which is aligned with at least one threaded hole in said outer surfaces of said external splice members, said side frame members detachably secured to said external splice members by way of screws.

12. The electronic rack and mounting frame as set forth in claim 1, wherein said horizontal frame members of said front frame panel are provided with a horizontally-extending ledge portion for preventing foreign materials from contaminating the internal components of said electronic equipment modules.

13. The electronic rack and mounting frame as set forth in claim 1, wherein said frame is reinforced by diagonally-extending brace members detachably secured to said side frame members.

14. The electronic rack and mounting frame as set forth in claim 1, wherein side frame members are provided with a plurality of shock mounts for supporting said frame within a hollow interior of a transport container.

15. The electronic rack and mounting frame as set forth in claim 1, wherein said vertical and horizontal frame members are made out of an extrudable, high tensile strength material.

16. The electronic rack and mounting frame as set forth in claim 15, said frame member material is aluminum.

* * * * *